(12) United States Patent
Hashimoto

(10) Patent No.: US 6,404,220 B1
(45) Date of Patent: *Jun. 11, 2002

(54) IC TESTING METHOD AND IC TESTING DEVICE USING THE SAME

(75) Inventor: Yoshihiro Hashimoto, Urawa (JP)

(73) Assignee: Advantest Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/319,898
(22) PCT Filed: Nov. 20, 1997
(86) PCT No.: PCT/JP97/04228
§ 371 (c)(1),
(2), (4) Date: Jun. 14, 1999
(87) PCT Pub. No.: WO99/27376
PCT Pub. Date: Jun. 3, 1999

(51) Int. Cl.[7] ............................................. G01R 31/26
(52) U.S. Cl. ..................................... 324/765; 324/73.1
(58) Field of Search .............................. 324/537, 765, 324/73.1, 158.1

(56) References Cited

U.S. PATENT DOCUMENTS

| | | | | |
|---|---|---|---|---|
| 4,045,736 A | * | 8/1977 | Carpenter et al. | 324/73.1 |
| 5,101,153 A | * | 3/1992 | Morong, III | 324/73.1 |
| 5,608,329 A | * | 3/1997 | Imamura | 324/537 |
| 5,917,834 A | * | 6/1999 | Arkin | 324/765 X |

FOREIGN PATENT DOCUMENTS

| | | |
|---|---|---|
| JP | 59-23676 | 2/1984 |
| JP | 63-29277 | 2/1988 |
| JP | 63-190975 | 12/1988 |
| JP | 5-209928 | 8/1993 |
| KR | 029364 | 7/1998 |

* cited by examiner

*Primary Examiner*—Glenn W. Brown
(74) *Attorney, Agent, or Firm*—David N. Lathrop, Esq.; Gallagher & Lathrop

(57) ABSTRACT

In an IC testing apparatus which executes a function test and a DC test, a resistor having a high resistance is connected to the output side of a DC tester such that the connection of the resistor allows a function test to operate normally if the DC tester is left connected to the function tester, thus allowing the DC test to be interrupted into the execution of the function test to enable a concurrent execution of the function test and the DC test. As a result, the time required to change switches in the DC tester, for example, can be executed during the function test, thus preventing the time interval required to change the switches from increasing the time interval required for the test, thereby reducing the testing time interval.

5 Claims, 6 Drawing Sheets

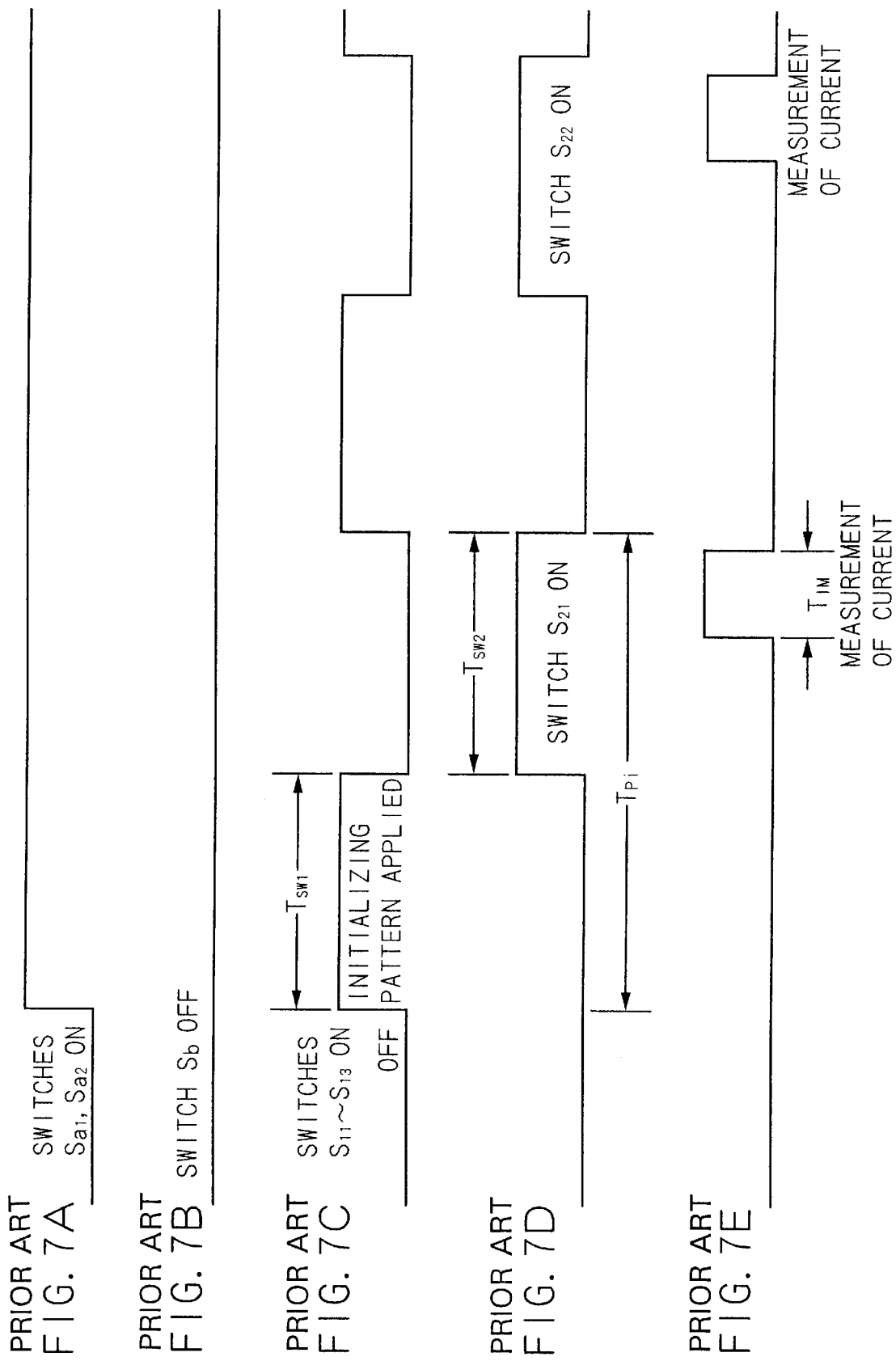

IC TESTING METHOD AND IC TESTING DEVICE USING THE SAME

TECHNICAL FIELD

The present invention relates to an IC testing method which enables a function test and a leak current test to be performed in a brief time interval when conducting a function test and a direct current (DC) test for a semiconductor device such as a memory formed by a semiconductor integrated circuit, and to an IC testing apparatus which employs the method.

BACKGROUND ART

Heretofore, an IC testing apparatus which tests a semiconductor device such as a memory performs a function test which determines whether or not the function of the semiconductor device is normally operating and a direct current test which determines whether or not respective terminals of the semiconductor device exhibit predetermined direct current characteristics. The IC testing apparatus determines an IC which proved to be normal in both the function test and the DC test to be an acceptable product.

FIG. 3 shows a schematic arrangement of an IC testing apparatus. In this Figure, character TES designates the entire IC testing apparatus. The IC testing apparatus TES is internally categorized into a main controller MAIN, a function tester 100 and a DC tester 200.

The main controller MAIN comprises a computer system, and controls the function tester 100 and the DC tester 200 through a bus line BUS. The function tester 100 comprises a pattern generator 102, a timing generator 104 and function test units 106A, 106B, . . . , 106N.

The function test units 106A–106N are associated with respective terminals of an IC tinder test 300 so that switches $S_{11}$–$S_{1n}$, can be turned on and off to have the function test units 106A–106N connected with or disconnected from the respective terminals of the IC under test 300.

Thus the function test takes place by controlling the switches $S_{11}$–$S_{1n}$ to their on conditions to have the function test units 106A–106N connected to the respective terminals of the IC under test 300 for applying test pattern signals to the respective terminals of the IC under test 300 to carry out the function test.

On the other hand, one or more DC testers 200 are provided for testing the terminals of the IC under test 300 (in the example shown in FIG. 3, the provision of the single DC tester 200 is shown). One or more DC testers 200 are arranged such that change-over switches $S_{21}$–$S_{2n}$ are controlled to be on such that each DC tester 200 is connected to only one of the terminals on the IC under test 300 at a time, thus sequentially testing the DC characteristic of the specific terminals. Incidentally, 400 designates a controller which controls these switches $S_{11}$–$S_{1n}$ and $S_{21}$–$S_{2n}$.

FIG. 4 shows an internal arrangement of one of the function test units, 106A, and the summary of the function test will be described. The function test unit 106A (the remaining function test units are similarly arranged) comprises a waveform formatter 11, a driver 12, a voltage comparator 13, a logical comparator 14 and a fault analysis memory 15.

The waveform formatter 11 receives test pattern data applied from the pattern generator 102 and produces a test pattern signal having an actual waveform. The timing generator 104 supplies a timing signal which defines the rise timing and the fall timing of the test pattern signal to the waveform formatter 11.

The test pattern signal delivered from the waveform formatter 11 is shaped by the driver 12 into a waveform of an amplitude having a given logical value, which is fed through the switch $S_{11}$ to a given terminal on the IC under test 300 to store data in the IC under test 300. If this terminal is an I/O terminal (a combined input and output terminal), the terminal on the IC under test 300 is set into an input mode when inputting the test pattern signal, and is switched to an output mode at the time when a write operation is performed. Content stored in the IC under test 300 is read out when switched into the output mode, and is fed through the voltage comparator 13 to the logical comparator 14. Incidentally, when the voltage comparator 13 reads data delivered from the IC under test 300, the output terminal of the driver 12 is set up in its high impedance mode.

The voltage comparator 13 determines by comparison whether the logic signal read out from the IC under test 300 attains a normal voltage value. Thus, voltage comparator 13 determines whether or not L logic and H logic levels are present, for example, 0.8 volt or lower and 2.4 volt or higher, respectively, and for a signal having a voltage that is a normal logic value, the appropriate logic value is input to the logical comparator 14.

An expected value is input to the logical comparator 14 from the pattern generator 102, and is compared against the logic value which is input from the voltage comparator 13, thus detecting the occurrence of any non-coincidence. In the event a non-coincidence occurs, it is assumed that there exists a fault in a memory cell it an address where a write operation took place, the fault is stored in the fault analysis memory 15 at this address, and subsequent to the completion of the test, the number of faulty cells is counted by reading out the fault analysis memory 15 to determine whether or not it is possible to salvage the IC under test 300.

FIG. 5 shows an example of the arrangement of the DC tester 200. The arrangement shown is one which is used when the DC tester 200 operates in a voltage applied current measuring mode. A voltage $V_L$ or $V_H$ is applied to a non-inverting input terminal of an operational amplifier 16 in response to a logic value from a DA converter 17 that is applied to a terminal on the IC under test 300.

A current detecting resistor R1 is connected between the output terminal of the operational amplifier 16 and a current output terminal $T_I$, a switch $S_{a2}$ is connected between the current output terminal $T_I$ and a sensing point SEN, a protective resistor R3 is connected between the current output terminal $T_I$ and a voltage detecting terminal $T_V$, and the voltage detecting terminal $T_V$ is connected to the sensing point SEN through a switch $S_{a1}$. The sensing point SEN is connected through a change-over switch $S_{21}$ to a terminal on the IC tinder test 300. An inverting input terminal of the operational amplifier 16 is connected to the voltage detecting terminal $T_V$.

Incidentally, a switch $S_b$ connected in shunt with the current detecting resistor R1 represents a range change-over switch which changes the current measuring range. By controlling the switch $S_b$ on, a resistor R2 of a smaller resistance, which allows a measurement of a high current (a current in the output mode of the IC under test 300), is connected in circuit, thus changing over to a high current measuring range.

With this arrangement of the DC tester 200, the voltage $V_L$ or $V_H$, applied to the non-inverting input terminal of the operational amplifier 16 from the DA converter 17 is applied to a terminal on the IC under test 300 by controlling the switches $S_{a1}$, $S_{a2}$ and the change-over switch $S_{21}$ to on conditions.

Specifically, since the operational amplifier 16 operates to make voltages at the non-inverting and the inverting input terminal equal to each other, if $V_L$, for example, is applied to the non-inverting input terminal of the operational amplifier 16, the output voltage is controlled so that the voltage at the inverting input terminal (equal to the voltage at the voltage detecting terminal $T_V$) also assumes $V_L$. Accordingly, the voltage $V_L$ or $V_H$, is applied to a terminal on the IC under test 300.

In the DC test mode, each terminal $P_i$ of the IC under test 300 is set up in its input mode as shown in FIG. 6. By measuring a current which passes through the current detecting resistor R1 under the condition that $V_1$ (a voltage providing an L logic) or $V_H$ (a voltage providing an H logic) is applied to the terminal $P_i$, respective leak currents $I_{Rek1}$ and $I_{Rek2}$ of active elements Q1 and Q2 connected to the terminal $P_i$ can be measured. Subtractor circuit 18 derives a voltage developed across the current detecting resistor R1, and AD converter 10 applies an AD conversion to the voltage obtained by the subtraction circuit 18 to deliver a digital value.

When measuring the leak currents $I_{Rek1}$, $I_{Rek2}$ passing through each input terminal of IC under test 300, change-over switch $S_b$ is turned off, thus measuring a voltage developed across the current detecting resistor R1 having a relatively high resistance on the order of 100 kΩ and measuring the leak currents $I_{Rek1}$ and $I_{Rek2}$ passing through each input terminal of the IC under test 300. Incidentally, the protective resistor R3 is formed by a resistor having a relatively small resistance (on the order of several 10's Ω), thus securing a closed feedback loop to the inverting input terminal of the operational amplifier 16 if the switches $S_{a1}$ and $S_{a2}$ are simultaneously controlled to be off during the actual operation. Resistor R3 thus protects the operational amplifier 16 by preventing an operation that would cause the operational amplifier 16 to saturate.

From the foregoing summary, the function test and the DC test in the IC testing apparatus should be understood. It is to be noted that heretofore, the function test and the DC test mentioned above have been performed in different time intervals, that is to say, after one of the tests is performed, the other test is performed. In particular, in the DC test, it is necessary to provide a control which changes the change-over switches $S_{21}, S_{22}\ldots S_{2n}$ and to provide a control which changes the switches $S_{11}$–$S_{1n}$ shown in FIG. 3. The manner of these controls will be described with reference to FIG. 7.

The function test is performed under the condition that the switches $S_{a1}$, $S_{a2}$ and the change-over switches $S_{21}$–$S_{2n}$. shown in FIG. 3 are all changed to off conditions to disconnect the DC tester 200 from the terminals on the IC under test 300 while the switches $S_{11}$–$S_{1n}$ are all controlled to on conditions. Thus, because the output impedance of the DC tester 200 is relatively low on the order of several Ω's, if the DC tester 200 is electrically connected as a load on the function tester 100 during the function test, the waveform of a test pattern signal which is fed from the function tester 100 to the IC under test 300 is degraded. This degradation prevents the function test from being performed in a normal manner.

For this reason, the function test is performed by controlling all of the change-over switches $S_{21}$–$S_{2n}$, and the switches $S_{a1}$, $S_{a2}$ to off conditions, which controls the DC tester 200 so that it is not connected to any terminal on the IC under test 300.

On the other hand, when performing the DC test, switches $S_{11}$–$S_{1n}$ are all initially controlled to on conditions, which connects the function test units 106A–106N to all the terminals on the IC under test 300. Under this condition, an initializing pattern for conducting the DC test is applied to the IC under test 300.

Specifically, if a terminal which is subject to the DC test is an I/O terminal, an initializing pattern (see FIG. 7C), which sets up an input mode as the mode for the terminal, is input from the function tester 100. After the input mode is set up at the terminal which is subject to the DC test, that terminal exercises a control which disconnects the function test units 106A–106N from all the terminals on the IC under test 300.

Under this condition, the change-over switch $S_{21}$ is controlled to be on for performing the DC test. The DC test measures the leak currents $I_{Rek1}$ and $I_{Rek2}$ (see FIG. 6) passing through the terminal under the condition that respective logic values of either H logic or L logic are applied to the terminals on the IC under test 300. If the leak current values are equal to or less than values which are previously predetermined, acceptability is determined, while if they are equal to or greater than the values, fault is determined.

In this manner, the DC test is performed for each terminal, and hence there is required, for each terminal tested, an interval $T_{pi}$ (see FIG. 7D) equal to the sum of an interval $T_{SW1}$ during which the switches $S_{11}$–$S_{1n}$ are controlled on and off in order to apply the initializing pattern and an interval $T_{SW2}$ during which the change-over switches $S_{21}$–$S_{2a}$ are controlled in a switching manner. The interval $T_{SW1}$ for applying the initializing pattern and the interval $T_{SW2}$ for controlling the change-over switches $S_{21}$–$S_{2n}$ correspond to a time interval (several ms) for changing the switches (relays), and even if the interval $T_{1M}$ (FIG. 7E) for measuring the current is short, the total interval $T_{pi}$ is relatively long. Accordingly, if a switching control of the switches $S_{11}$–$S_{1n}$ and the change-over switches $S_{21}$–$S_{2n}$ is executed for every terminal, there results an inconvenience that the DC test requires a long period of time. This hinders the testing of large quantities of IC's.

It is an object of the invention to propose an IC testing method capable of testing quantities of IC's in a brief interval by reducing the testing interval of an IC, and an IC testing apparatus which utilizes the testing method.

DISCLOSURE OF THE INVENTION

The invention is characterized by an arrangement which allows the DC tester to remain connected to a terminal on an IC under test even during the function test, which is enabled by connecting the DC tester to a terminal on the IC under test through a resistor such that the connection of the resistor prevents the DC tester from presenting a significant load as viewed from the function tester.

With this arrangement, there is proposed an IC testing method which permits the DC test to be executed by controlling the output terminal of a driver of the function tester to be put into a high impedance mode even during the function test, thus dispensing with the need for a switch control to disconnect the function tester during the time the DC test is being executed and thus allowing an execution of a leak test during the interval for the functions test.

Thus, with the IC testing method according to the invention, the leak test for a DC test item is completed at a time coincident with the end of the function test, thus eliminating the need for a special time interval to conduct the leak test. Consequently, there is obtained an advantage that the length of time required for the test can be significantly reduced.

In addition, the present invention proposes an IC testing apparatus which utilizes the IC testing method mentioned above.

An IC testing apparatus according to the invention comprises a function tester for executing the function test of an IC under test by applying a test pattern signal to each terminal on the IC under test from a driver which is capable of setting up a status of an output terminal thereof in a high impedance mode;

a DC tester for measuring a leak current passing through each terminal on an IC under test under a condition that a given voltage is applied to each terminal on the IC under test;

a resistor connected between the sensing point of the DC tester and the terminal on the IC under test;

first control means for causing a given voltage to be delivered to the sensing point of the DC tester during the execution of the function test by the function tester;

second control means for controlling the output terminal of the driver of the function tester in a high impedance mode at the time a control operation by the first control means is completed;

and current measuring means for measuring a leak current passing through a terminal of the IC under test under a condition that the output terminal of the driver is controlled in a high impedance mode.

With the IC testing apparatus according to the invention, there is no need to disconnect the function tester and the DC tester from each other during the execution of the function test and also during the execution of the DC test. Accordingly, the DC test can be executed during the execution of the function test without a need for the time to change the switch.

As a consequence, if the DC test is executed during the execution of the function test, the DC test is dispersed in a compound form in the function test, and there is obtained an advantage that a length of time for the compounded test cannot be significantly longer than the length of time required for the inherent function test, thus allowing the function test and a leak test to be completed within a brief interval.

BRIEF DESCRIPTION OF THE DRAWINGS

FIG. 7 shows timing charts illustrating the manner of a conventional DC test.

BEST MODE OF CARRYING OUT THE INVENTION

A more detailed description of the invention will be described with reference to the attached drawings.

Figure 1:
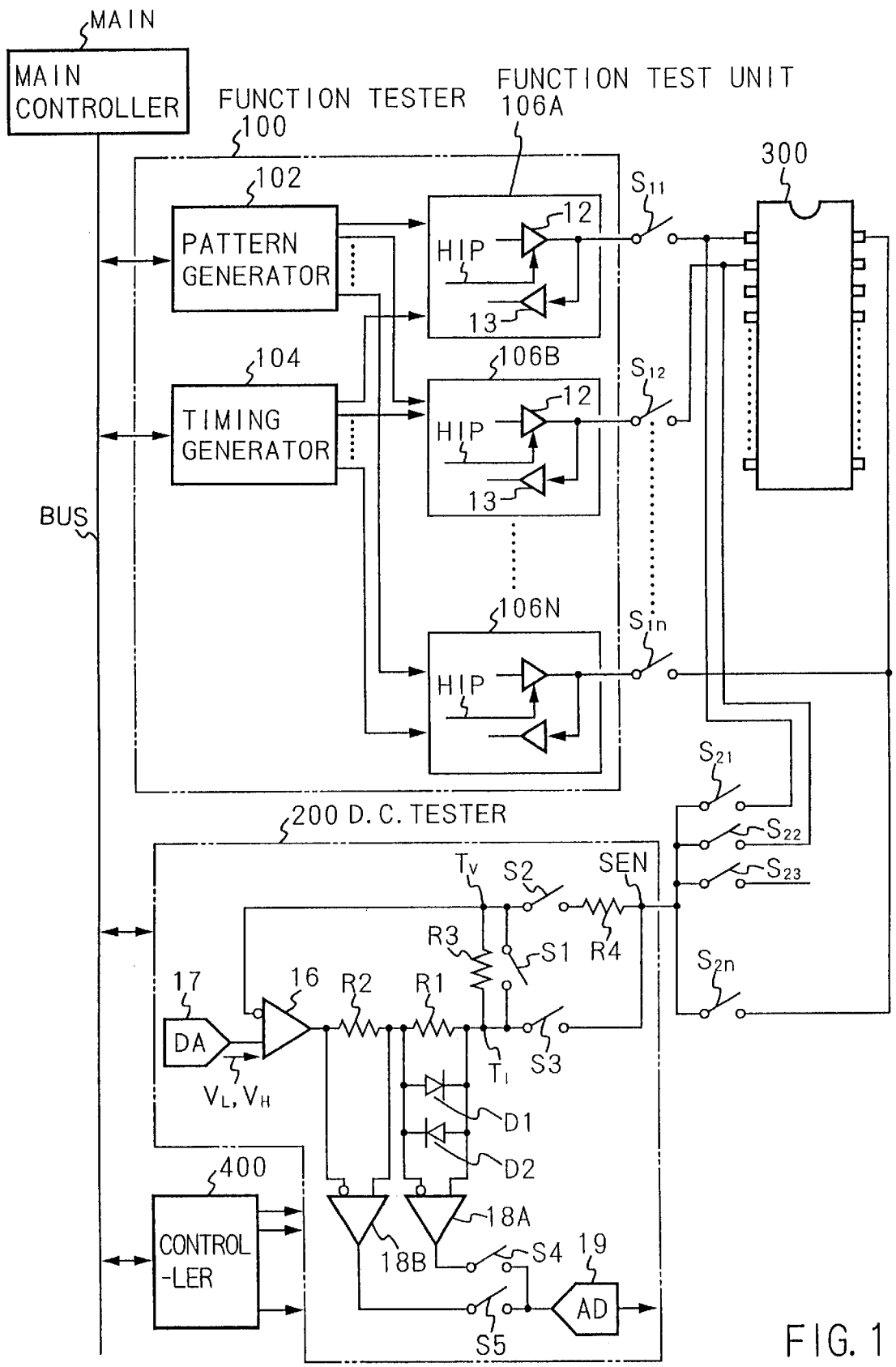
FIG. 1 is a block diagram of one embodiment of an IC testing apparatus which adopts an IC testing method according to the invention.
Figure 3:
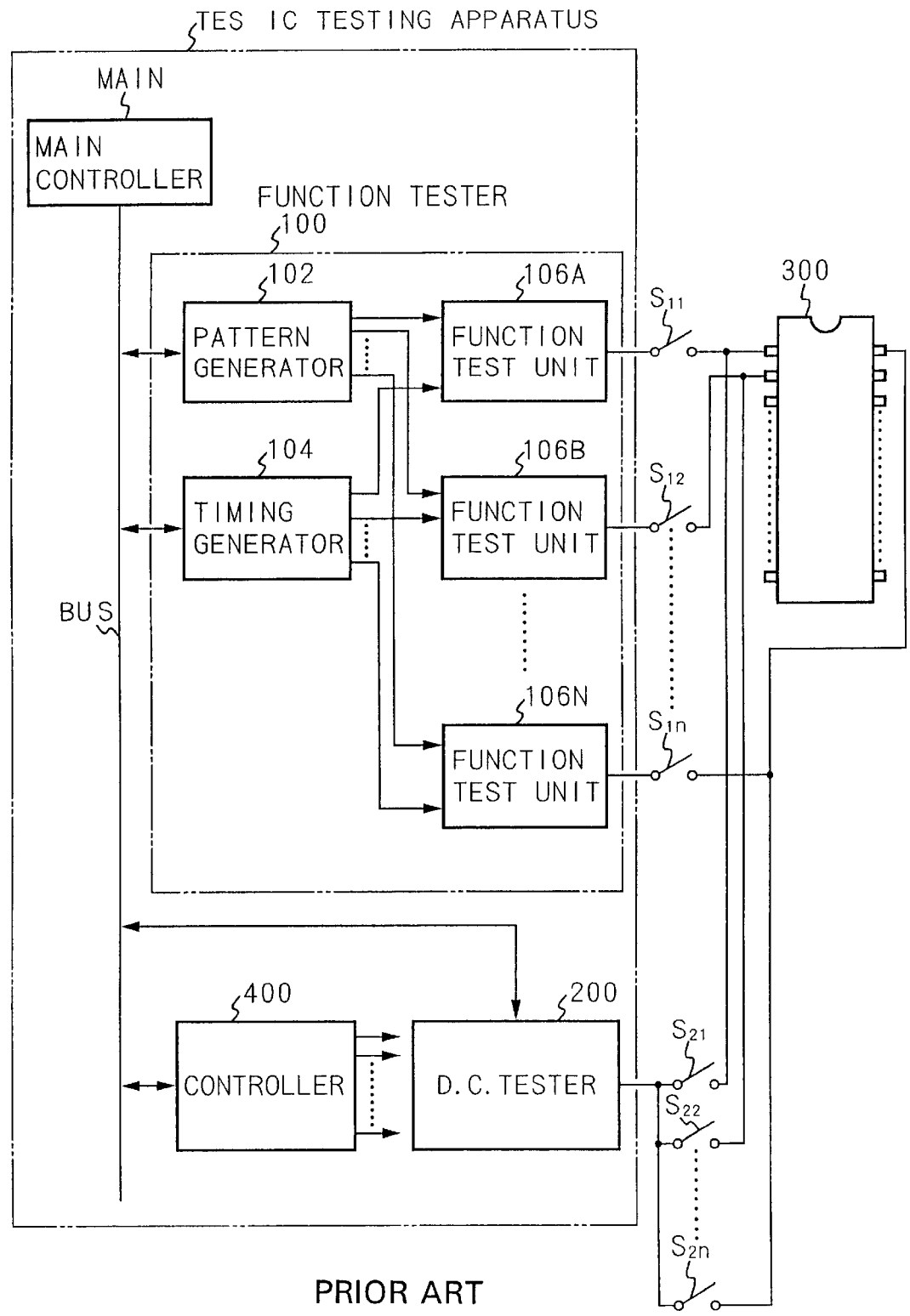
FIG. 3 is a block diagram schematically illustrating a conventional IC testing apparatus.
Figure 4:
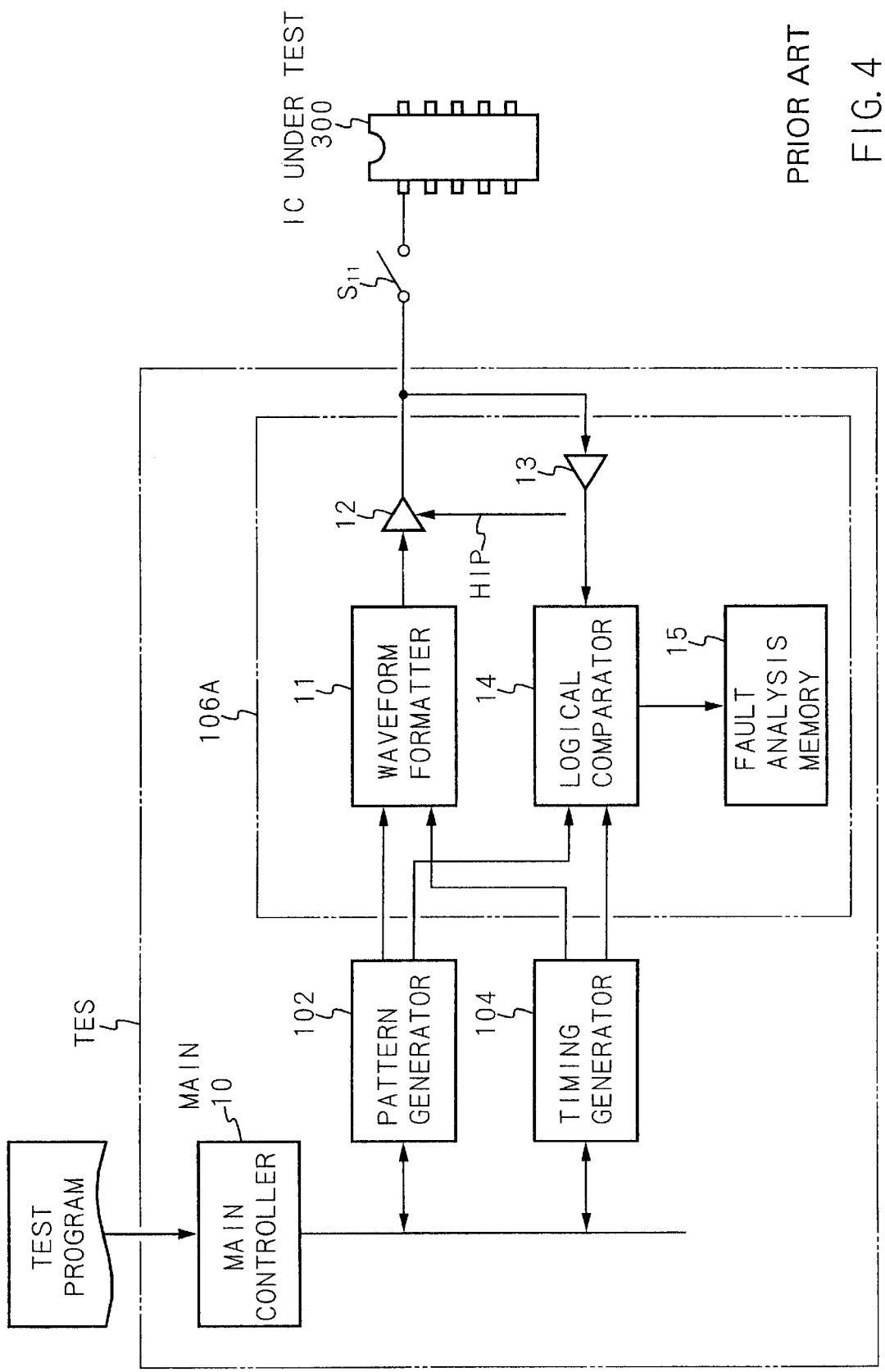
FIG. 4 is a block diagram showing an arrangement of a function tester used in the IC testing apparatus shown in FIG. 3.

FIG. 1 shows an embodiment of an IC testing apparatus which tests an IC under test 300 according to an IC testing method which is proposed by the present invention. In this Figure, function tester 100 and DC tester 200 are similar to the corresponding components described above in connection with FIG. 3. When conducting a function test, all of switches $S_{11}$–$S_{1n}$ are controlled to be on, thus connecting all the function testing units 106A–106N to the respective terminals of IC under test 300.

The DC tester 200 sequentially controls one of the change-over switches $S_{21}$–$S_{2n}$ to be on, selectively connecting the DC tester 200 to each terminal of the IC under test 300 to conduct a DC test of each terminal alone, Incidentally, although a plurality of DC testers 200 are provided in actuality to provide an arrangement in which the DC test can be completed within a brief interval by reducing the number of terminals undertaken by each tester, the present description assumes that the DC tester 200 is implemented as a single DC tester 200.

The IC testing apparatus according to the invention is characterized in that in the DC tester 200, a resistor R4 is connected in series with a switch S2 between the voltage detecting terminal $T_V$ and the sensing point SEN.

Specifically, in the DC tester 200, a protective resistor R3 connected between a current output terminal $T_I$ and a voltage detecting terminal $T_V$ is shunted by a first switch S1, while the second switch S2 and the resistor R4 are connected in series with the voltage detecting terminal $T_V$ and sensing point SEN. In addition, a third switch S3 is connected between the current output terminal $T_I$ and the sensing point SEN.

When executing the function test, the first switch S1 and the second switch S2 are turned on while the third switch S3 is turned off Under this condition, the resistor R4 is connected in series between the sensing point SEN and the current output terminal $T_I$ and the voltage detecting terminal $T_V$. Accordingly, an impedance of the DC tester 200 as viewed from the function test unit which is connected to the DC tester 200 can be regarded as the resistance of the resistor R4. By choosing a resistance of the resistor R4 to be about 10 kC2, the impedance of the DC tester 200 as viewed from the function test units 106A–106N can be regarded as about 10 kΩ.

A signal transmission line which connects between each of the function test units 106A–106N and an IC under test 300 is generally matched to a characteristic impedance of 50Ω. Accordingly, if a load of 10 kΩ (DC tester 200) were connected to each output of the function test units 106A–106N, there can be no significant variation in the line impedance, and the waveform of a test pattern signal which is fed from the function testing units 106A–106N to the IC under test 300 cannot be disturbed by the connection of the DC tester 200. In other words, if the DC tester 200 is remains connected to somewhere on the IC under test 300 during the function test, the waveform of a test pattern signal applied to the terminal which is connected to the DC tester 200 cannot be disturbed, allowing the function test to be normally executed.

It will be understood from the foregoing description that the function test can be executed while DC tester 200 is connected to the function test units.

In addition, the present invention proposes a method of executing a DC test (leak test) during the execution of the function test while maintaining the function test units 106A–106N are connected to the respective terminals on the IC under test 300.

Thus, there is proposed a method of measuring a leak current which passes through a terminal on the IC under test 300 without controlling the switches $S_{11}$–$S_{1n}$ to be off. The method comprises controlling an output status of a driver 12 of the function test unit connected to the terminal, the leak current through which is to be measured by the DC tester 200, in a high impedance mode during the time interval a given voltage (a voltage providing an H logic or L logic) is applied to such terminal and measuring a leak current passing through the terminal on the IC under test 300 by means of DC tester under the condition that the driver 12 is controlled to be in its high impedance mode.

To this end, during the execution of the function test, a main controller MAIN provides a command signal which causes the DC tester 200 to produce a given voltage (either L logic or H logic). Specifically, it applies a digital value for producing a given voltage to a DA converter 17. The DA converter 17 effects a DA conversion of the digital value to deliver a voltage $V_L$ or $V_H$, which is applied to a non-inverting input terminal of an operational amplifier 16 in DC tester 200.

The operational amplifier 16 operates in a manner such that a voltage at the voltage detecting terminal $T_V$ is equal to the voltage applied to the non-inverting input terminal. As a consequence, there is produced a voltage at the voltage detecting terminal $T_V$ which is equal to the $V_L$ or $V_H$ supplied by the DA converter 17, and this voltage is applied to the sensing point SEN through the second switch S2 and the resistor R4, and is then fed to a terminal on IC under test 300 through one of the change-over switches $S_{21}$–$S_{2n}$.

Figure 2:
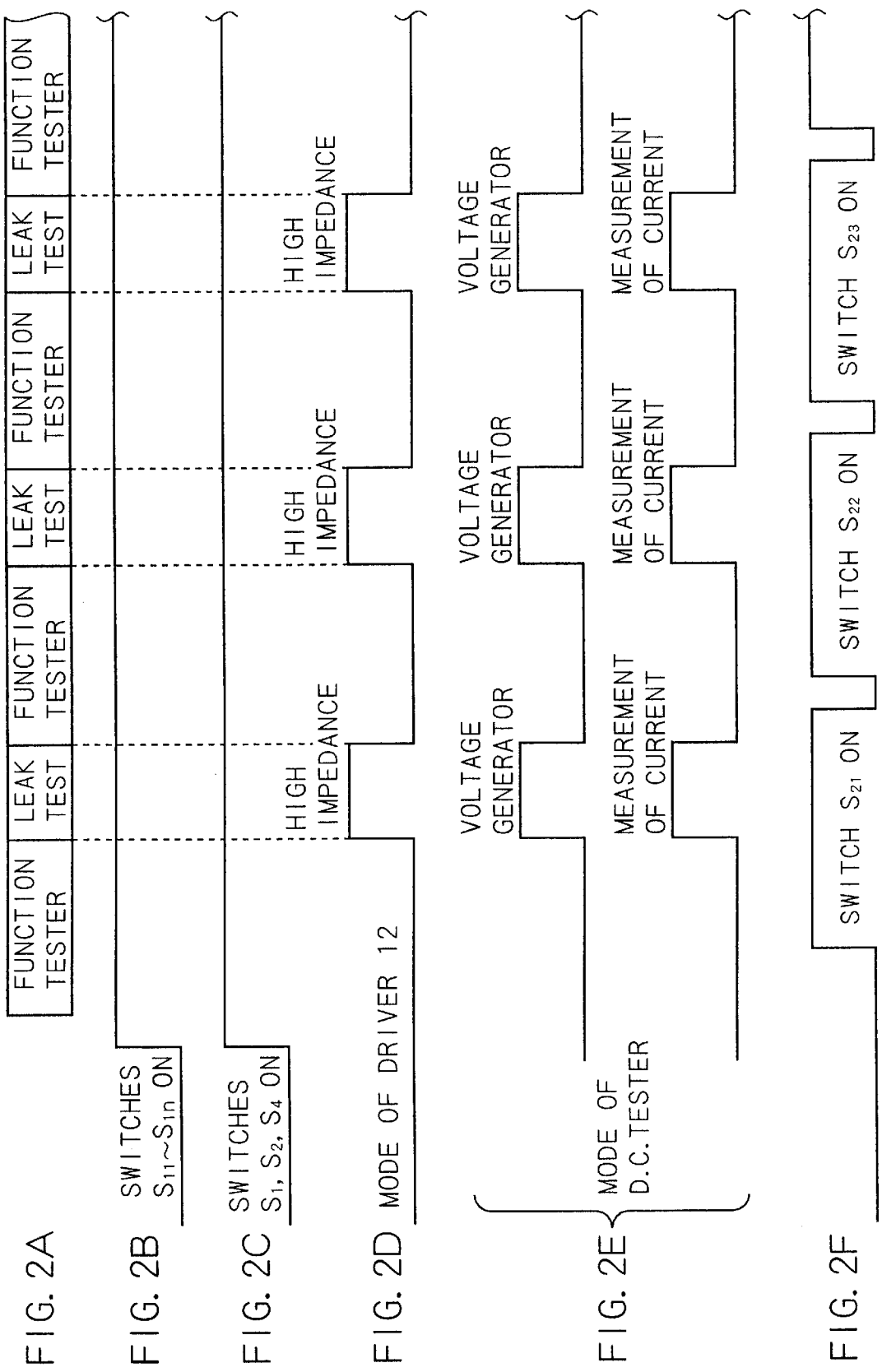
FIG. 2 shows timing charts illustrating the IC testing method according to the invention.

During the execution of the function test, the switches $S_{11}$–$S_{1n}$ and the switches S1, S2, S4 are all turned on. The time interval to execute DC leak test may be determined, for example, as follows: A DC test time interval (a time interval that has a length required to test a single terminal) as shown in FIG. 2A is previously set up in a function test portion of a test program which is read into the main controller MAIN; a control signal HIP is produced during the DC test time interval that controls all the drivers 12 for respective function test units 106A–106N or driver 12 connected to the terminal which is subject to the DC test to be in a high impedance mode (see FIG. 2D), thus controlling the driver 12 to be in its high impedance condition while applying a voltage generating command to the DC tester so as to control the DC tester 200 to generate a given voltage for measuring the leak current.

Incidentally, the DC test time interval, which interrupts the time interval of the function test, may be chosen to occur immediately after a test pattern signal is written into an IC under test 300 to allow the DC test to be executed more quickly since the individual terminals on the IC under test 300 are already set up in an input mode when the write operation takes place.

After the leak test is executed with respect to a single terminal, the function test is resumed. During the execution of the function test, the change-over switches $S_{21}$–$S_{2n}$ are changed (see FIG. 2E), thus connecting the DC tester 200 to another terminal. A DC test time interval may be provided at any timing position subsequent to the completion of such connection for execution of the leak test of a next terminal.

When change-over switches $S_{21}$–$S_{2n}$ are changed during the execution of the function test in this manner, the time interval required for the leak test which is inserted into the execution of the function test can be very short, and if the function test and the DC test are executed concurrently, the overall required time will not be significantly longer than the length of time required for the function test alone.

Figure 5:
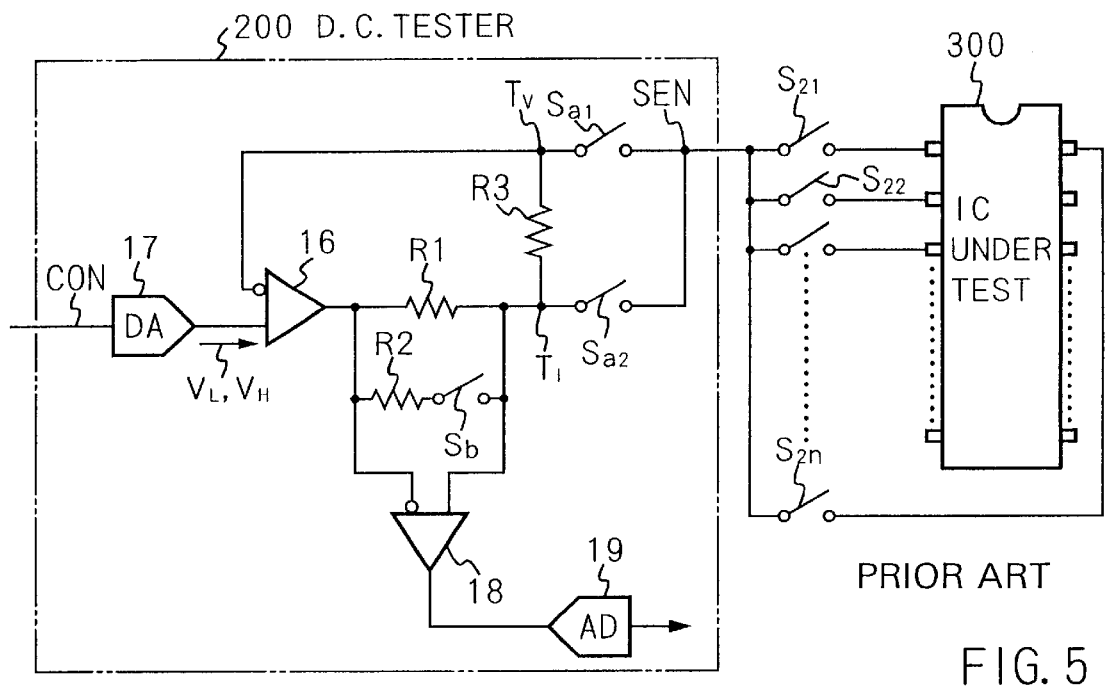
FIG. 5 is a circuit diagram illustrating the arrangement of a DC tester used in the IC testing apparatus shown in FIG. 3.
Figure 6:
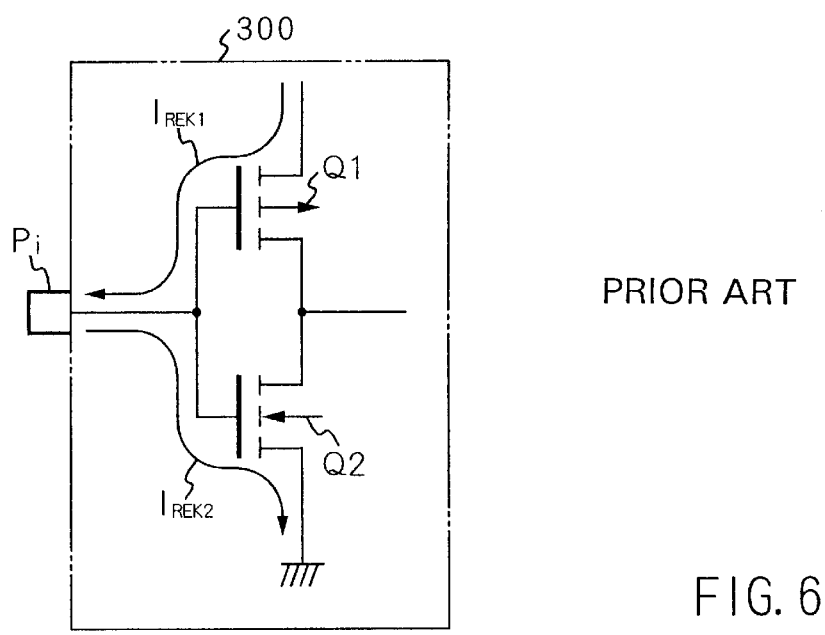
FIG. 6 is a circuit diagram illustrating a situation of a terminal on the IC under test when executing a leak test for DC test item.

Incidentally, a current measuring circuit of the DC tester 200 will be briefly described. In the present embodiment, a resistor R1 having a high resistance (on the order of 100 kΩ) for measuring a minimal current (leak current) and a resistor R2 having a small resistance (on the order of 100Ω) for measuring a high current (an output current from the IC under test) are connected in series, thus omitting the range changing switch $S_b$ shown in FIG. 5. Specifically, the minimal current measuring resistor R1 is shunted by diodes D1 and D2. For measurement of high currents, these diodes D1 and D2 are turned on, allowing the high current to be bypassed by diodes D1 or D2, and under this condition, a voltage developed across the resistor R2 is detected by the subtraction circuit 18B, and fed through switch S5 to the AD converter 19 for AD conversion therein to be input to the main controller MAIN, for example.

On the other hand, when measuring a minimal current, only a voltage on the order of several tens of mV can be developed across the resistor R1. Accordingly, the diodes D1 and D2 remain off. Thus, by measuring a voltage developed across the resistor R1, a leak current passing through a terminal on an IC under test 300 can be measured. Specifically, a voltage developed across the register R1 is picked out by the subtraction circuit 18A, and is then fed through the switch S4 to the AD converter 19 for the AD conversion therein, to be input to the main controller MAIN where it is compared against a reference value to determine if it is acceptable or faulty.

Incidentally, in a high current measuring mode in which a current which occurs in an output mode of the IC under test 300 is measured, the switches $S_{11}$–$S_{1n}$ are controlled to be off, and the function tester 100 is disconnected from the IC under test while only the DC tester 200 is connected to the IC under test 300. In addition, within the DC tester 200, the first S1 switch is turned off, the second and the third switch S2, S3 are turned on, the switch S4 is turned off, and the switch S5 is turned on for the execution of the DC test.

As described above, with the IC testing method according to the invention, changing $S_{21}$–$S_{2n}$ which takes time for its completion due to their slow response is effected during the execution of the function test, and the driver 12 is controlled to its high impedance mode in the course of the function test in order to execute the DC test (the leak test). Accordingly, the function test and the leak test can be completed in a time interval represented by a sum of time intervals required for the function test and a net time interval required for the DC test (which does not include a time interval to change the switches). As a consequence, there is obtained an advantage that an overall testing time interval may be considerably reduced. It then follows that its effect will be remarkable when applied in testing quantities of IC's in a brief time interval by IC manufacturers, for example.

What is claimed is:

1. A method for use in an IC testing apparatus comprising a function tester that includes a driver having an output terminal and a DC tester that includes a sensing point, wherein the method comprises:

controlling the function tester to execute a function test of an IC under test by applying a test pattern signal from the output terminal to a terminal of the IC under test;

connecting the sensing point of the DC tester to the terminal of the IC under test through a resistor during execution of the function test of the IC under test by the function tester, controlling the output terminal of the driver of the function tester to be in a high impedance condition while the DC tester provides a given voltage at the sensing point, controlling the DC tester to measure a leak current passing through the terminal of the IC under test, thereby measuring the leak current during the execution of the function test.

2. An IC testing apparatus comprising a function tester that includes a driver having an output terminal, wherein the function tester executes a function test of an IC under test by applying a test pattern signal from the output terminal to a terminal on the IC under test;

a DC tester that includes a sensing point and a resistor connected between the sensing point and the terminal of the IC under test, wherein the DC tester is adapted to measure a leak current passing through the terminal of the IC under test while applying a given voltage to the sensing point;

first control means for causing the DC tester to apply the given voltage to the sensing point during the execution of the function test by the function tester;

second control means for controlling the output terminal of the driver of the function tester to be in a high impedance condition at a time when the first control means causes the DC tester to apply the given voltage to the sensing point; and current measuring means for causing the DC tester to measure the leak current passing through the terminal of the IC under test while the output terminal of the driver is controlled to the high impedance condition.

3. An IC testing apparatus according to claim 2 wherein the DC tester comprises:

an operational amplifier having a non-inverting input terminal, an inverting input terminal and an output terminal coupled to a current detecting resistor, wherein the given voltage is applied to the non-inverting input terminal, an output voltage is delivered by the output terminal to the sensing point through the current detecting resistor, and the voltage at the sensing point being fed back to the inverting input terminal, and current measuring means for measuring a voltage developed across the current detecting resistor to measure the value of a leak current passing through the terminal on the IC under test.

4. An IC testing apparatus according to claim 2 wherein the DC tester comprises:

an operational amplifier having an output terminal, a non-inverting input terminal and an inverting input terminal, a current detecting resistor having one end connected to the output terminal of the operational amplifier and the other end connected to a current output terminal, a first switch for applying a voltage delivered at the current output terminal to a voltage detecting terminal, a protective resistor connected between the current output terminal and the voltage detecting terminal, a feedback circuit for feeding the voltage at the voltage detecting terminal back to the inverting input terminal of the operational amplifier, a series circuit including a second switch and a resistor for applying a voltage at the voltage detecting terminal to the terminal on the IC under test through a sensing point, a third switch connected between the current output terminal and the sensing point, and a current measuring means for measuring a voltage developed across the current detecting resistor to measure a current passing through the terminal on the IC under test, and wherein, during execution of the functional test while the leak current passing through the terminal on the IC under test is measured, the first switch and the second switch are operated so that the DC tester as viewed from the function tester appears to have a high impedance due to the resistor.

5. An IC testing apparatus according to claim 4 wherein, when a DC test mode takes place while a function test is not being executed, the first, second and third switches are operated so that the current output terminal is connected directly to the sensing point and to the terminal on the IC under test.

* * * * *